United States Patent [19]
Wakai et al.

[11] Patent Number: 5,821,137
[45] Date of Patent: Oct. 13, 1998

[54] THIN FILM SEMICONDUCTOR DEVICE INCLUDING A DRIVER AND A MATRIX CIRCUIT

[75] Inventors: Haruo Wakai, Hamura; Shinichi Shimomaki, Akishima; Tatuya Miyakawa, Fussa, all of Japan

[73] Assignee: Casio Computer Co., Ltd., Tokyo, Japan

[21] Appl. No.: 441,395

[22] Filed: May 15, 1995

Related U.S. Application Data

[62] Division of Ser. No. 287,849, Aug. 9, 1994, Pat. No. 5,477,073.

[30] Foreign Application Priority Data

| Aug. 20, 1993 | [JP] | Japan | 5-226715 |
| Dec. 14, 1993 | [JP] | Japan | 5-342109 |
| Dec. 15, 1993 | [JP] | Japan | 5-342239 |

[51] Int. Cl.$^6$ .......................... H01L 21/336; H01L 21/84
[52] U.S. Cl. .......................... 438/163; 438/166; 438/487
[58] Field of Search .......................... 437/21, 40 TFI, 437/41 TFI, 101, 173, 174; 438/163, 166, 486, 487, 535, 308, 795

[56] References Cited

U.S. PATENT DOCUMENTS

| 5,145,808 | 9/1992 | Sameshima et al. | 437/174 |
| 5,210,438 | 5/1993 | Nakamura | 257/536 |
| 5,248,623 | 9/1993 | Muto et al. | 437/21 |
| 5,397,718 | 3/1995 | Furuta et al. | 437/174 |
| 5,420,048 | 5/1995 | Kondo | 437/21 |
| 5,432,122 | 7/1995 | Chae | 437/174 |
| 5,496,768 | 3/1996 | Kudo | 437/174 |
| 5,529,630 | 6/1996 | Imahashi et al. | 437/174 |
| 5,529,951 | 6/1996 | Noguchi et al. | 437/174 |
| 5,561,081 | 10/1996 | Takenouchi et al. | 437/174 |

FOREIGN PATENT DOCUMENTS

| 55-61069 | 5/1980 | Japan | 257/347 |
| 59-96761 | 6/1984 | Japan | 257/347 |
| 64-76715 | 3/1989 | Japan . | |
| 1-96961 | 4/1989 | Japan | 257/347 |
| 2-73623 | 3/1990 | Japan . | |
| 3-286518 | 12/1991 | Japan . | |

OTHER PUBLICATIONS

Wagner et al., Formation of p–n Junctions and Silicides Using a High Performance Laser Beam Homogenization System, Applied Surface Science, vol. 43, 1989, pp. 260–263.

Jhon et al., Crystallization of Amorphous Silicon by Excimer Laser Annealing With a Line Shape Beam Having a Gaussian Profile, Jpn. J. Appl. Phys., vol. 33, 1994, pp. L 1438–L 1441, Part 2, No. 10B, 15 Oct. 1994.

*Primary Examiner*—Mary Wilczewski
*Attorney, Agent, or Firm*—Frishauf, Holtz, Goodman, Langer & Chick

[57] ABSTRACT

A thin film transistor including a thin semiconductor film which has a central portion as a channel region, with the side portions of the semiconductor film except for the channel region being a source and a drain regions which includes n-type impurities such as phosphorus ions of high concentration ($3 \times 10^{15}$ atoms/cm$^2$), and a low concentration region provided between the channel region and each of the source and drain regions including p-type impurities such as boron ions of a low concentration ($1 \times 10^{13}$ atoms/cm$^2$) whereby the low concentration region serves to reduce the off current.

14 Claims, 5 Drawing Sheets

THIN FILM SEMICONDUCTOR DEVICE INCLUDING A DRIVER AND A MATRIX CIRCUIT

This is a division of application Ser. No. 08/287,849 filed Aug. 9, 1994, now U.S. Pat. No. 5,477,073 issued Dec. 19, 1995.

BACKGROUND OF THE INVENTION

1. Field of the Invention

The present invention relates to a semiconductor device including a driver and a matrix circuit, and more particularly to the semiconductor device which reduces a possible off current flowing through each of thin film transistors which constitutes a part of the matrix circuit.

2. Description of the Related Art

FIG. 6 shows one example of a conventional thin film transistor, which includes a substrate 1, for example, of glass, and a semiconductor film 2 formed at a predetermined position on an upper surface of the substrate 1. The semiconductor film 2 has a channel 2a at its central portion with a source and a drain region 2b at the corresponding side portions of the film 2 excluding the channel 2a. A gate insulation film 3 is formed on the whole surface of the substrate 1 and the semiconductor film 2. A gate electrode 4 is formed on an upper surface of that portion of the gate insulation film 3 corresponding to the channel region 2a. An inter-layer insulation film 5 is formed on the whole surface of the gate insulation film 3 and the gate electrode 4. Contact holes 6 are formed in those parts of the inter-layer insulation film 5 and gate insulation film 3 corresponding to the source and drain regions 2b. Source and drain electrodes 7 are formed in the corresponding contact holes 6 and at a predetermined position on the inter-layer film 5.

When the gate electrode 4 of an NMOS thin film transistor of the above structure had a width of 60 $\mu$m and a length of 6 $\mu$m, the transistor exhibited the $V_G$ (gate voltage)—$I_D$ (drain current) characteristic of FIG. 7. As is clear in FIG. 7, when the drain voltage $V_D$ was 1 or 5 V, the on/off current ratio was large, for example, on the order of a number of seven figures, and showed that the characteristic was excellent. The off current, however, was $10^{-11}$ A when the drain voltage $V_D$ was 1 V, and $10^{-10}$ A when the drain voltage $V_D$ was 5 V, i.e., the off current was relatively large.

That is, there is the problem with the conventional thin film transistor that the off current and hence the leakage current are relatively large.

SUMMARY OF THE INVENTION

It is therefore an object of the present invention to provide a thin film semiconductor device which includes a thin film transistor which provides a reduced off current.

According to the present invention, there is provided a thin film semiconductor device comprising:

a substrate; and
a thin film transistor formed on the substrate, the transistor comprising
a thin semiconductor film including a channel region, a source region provided at one end of the channel region and highly diffused with impurities of one conductivity type therein, a drain region provided at the other end of the channel region and highly diffused with impurities of the one conductivity type therein, two low concentration regions, one of which is provided between the channel region and the source region and the other of which is provided between the channel region and the drain region, and each being low diffused with impurities of the other conductivity type therein;
a gate insulation film formed on the channel region of the thin semiconductor film;
a gate electrode formed on the gate insulation film;
a source electrode connected to the source region; and
a drain electrode connected to the drain region.

DESCRIPTION OF THE PREFERRED EMBODIMENT

Figure 1:
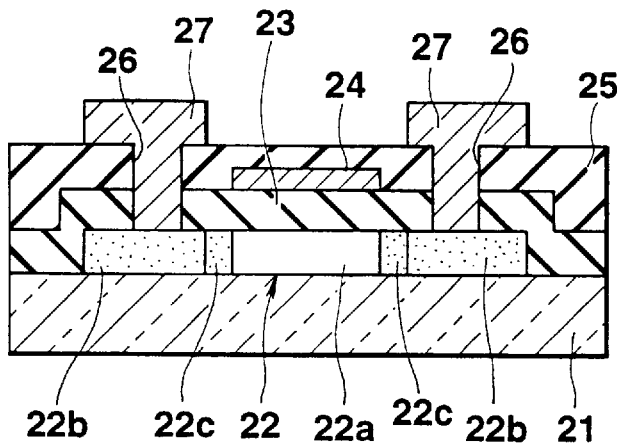
FIG. 1 is an enlarged cross-sectional view of a thin film semiconductor device including a thin film transistor according to the present invention.

FIG. 1 shows one embodiment of a thin film transistor of the present invention. The thin film transistor includes a substrate 21, for example, of glass, and a semiconductor film 22 formed in position on an upper surface of the substrate 21. The semiconductor film 22 may be formed on an underlying film of silicon oxide or silicon nitride formed on the substrate 21. The semiconductor film 22 has a central portion as a channel 22a with a source and a drain region 22b which include a high concentration impurity of one conductivity type at the respective side portions of the semiconductor film excluding the channel 22a. A region 22c which includes a low concentration impurity of the other conductivity type (p-type when the source and drain regions 22b are of the n-type while n-type when the source and drain regions 22b are of the p-type) is provided between the channel region 22a and each of the source and drain regions 22b. A gate insulation film 23 is formed on the whole surface of the substrate 21 and the semiconductor film 22. A gate electrode 24 is formed on an upper surface of that portion of the gate insulation film 23 corresponding to the channel region 22a. An inter-layer insulation film 25 is formed on the whole surface of the gate insulation film 23 and the gate electrode 24. Contact holes 26 are formed in those portions of the inter-layer insulation film 25 and gate insulation film 23 corresponding to the source and drain regions 22b. Source and drain electrodes 27 are formed in the corresponding contact holes 26 and at a predetermined position on an upper surface of the interlayer insulation film 25.

Figure 2:
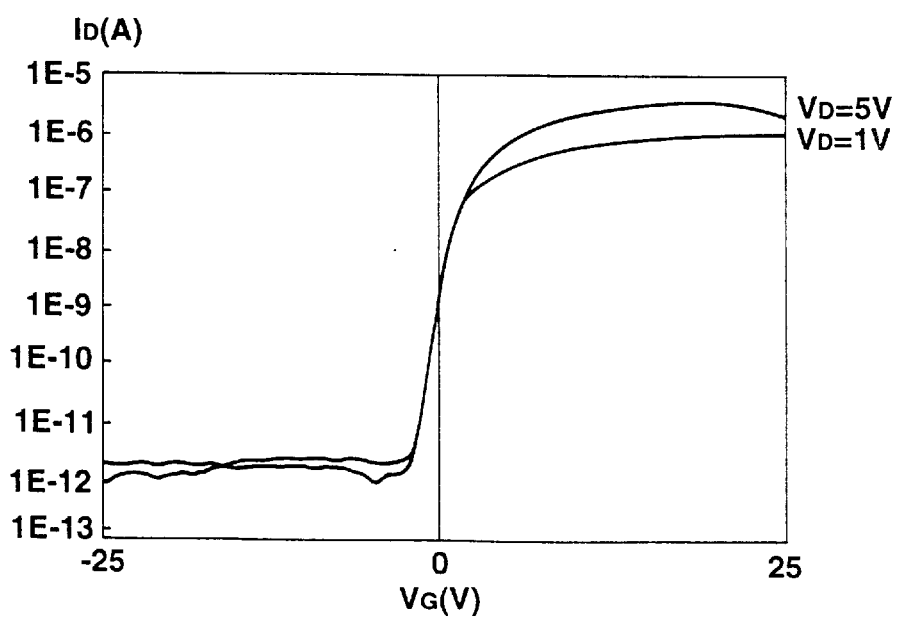
FIG. 2 is a diagram indicative of the $V_G$–$I_D$ characteristic of the transistor of FIG. 1.

When the gate electrode 24 of the NMOS thin film transistor of the above structure had a width of 40 $\mu$m and a length of 6 μm; the source and drain regions 22b included an n-type impurity, for example, of a phosphorus ion of high concentration ($3 \times 10^{15}$ atoms/cm$^2$); and the region 22c included a p-type impurity, for example, of a boron ion, of a low concentration ($1 \times 10^{13}$ atoms/cm$^2$), the transistor exhibited the $V_G$–$I_D$ characteristic of FIG. 2. As is clear in FIG. 2, when the drain voltage $V_D$ was 1 or 5 V, the off current was on the order of $10^{-12}$ A, which is smaller by about one or two orders of magnitude compared to the conventional thin film transistor of FIG. 6.

Figure 6:
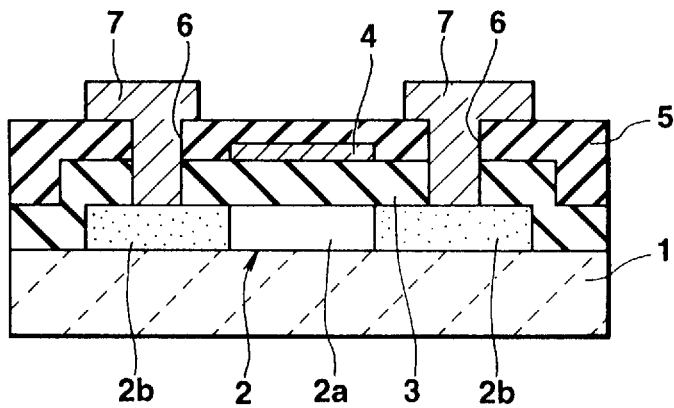
FIG. 6 is an enlarged cross-sectional view of a thin film semiconductor device including a conventional thin film transistor.

As described above, in this transistor, the off current is reduced by about one to two orders of magnitude compared to the conventional transistor of FIG. 6. Thus, a possible leakage current is reduced by one to two orders of magnitude. While in the above embodiment the low concentration impurity region of the other conductivity type has been described as being also formed on the side of the source region, it may not be so formed.

Figure 3:
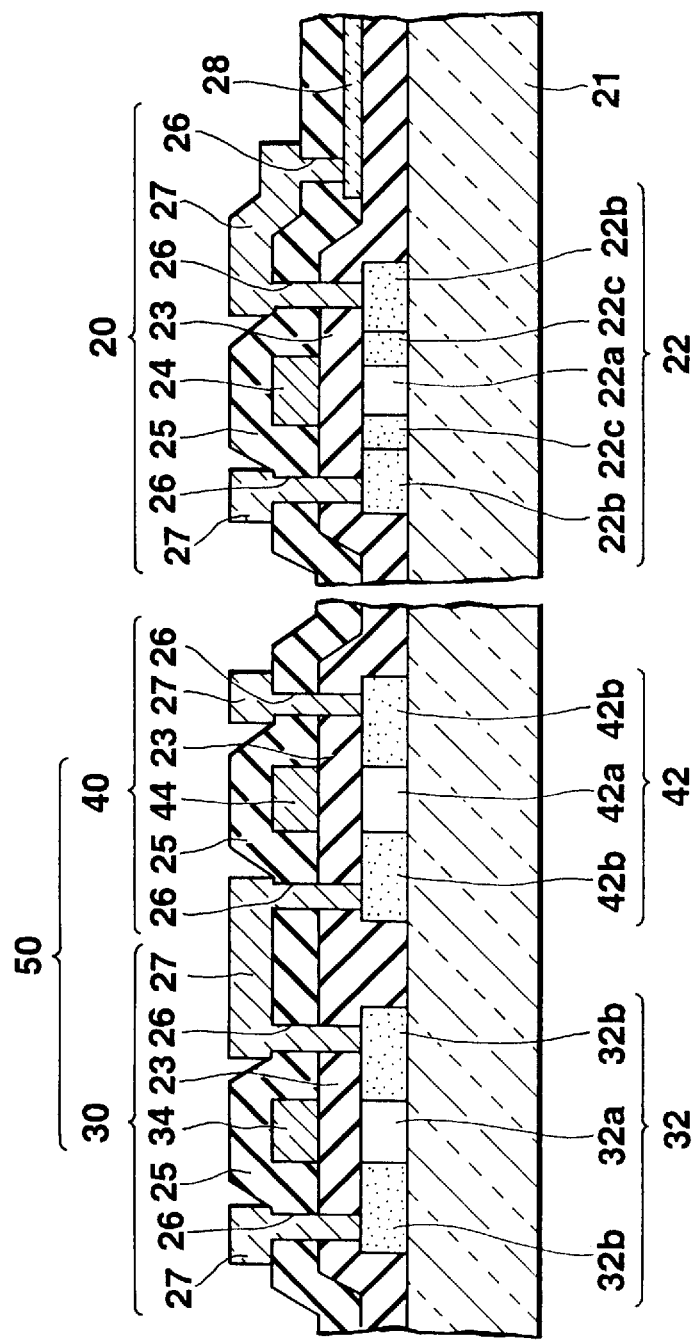
FIG. 3 is an enlarged cross-sectional view of the main portion of an active matrix type liquid crystal display panel to which the present invention is applied.
Figure 5:
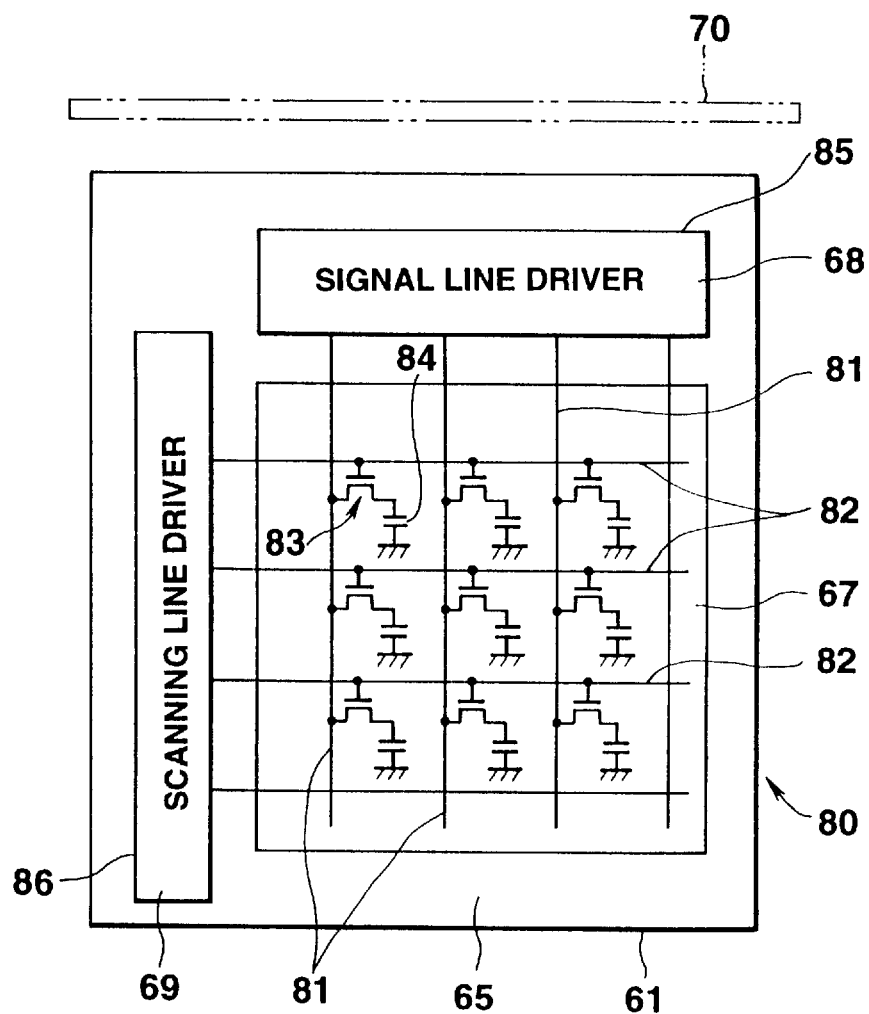
FIG. 5 is a plan view of the panel for illustrating a laser beam irradiation method in FIG. 4A.

FIG. 3 is an enlarged cross-sectional view of an active matrix type liquid crystal display panel of FIG. 5 to which the present invention is applied. In the panel 80 of FIG. 5, a signal line driver 68 and a scan line driver 69 are formed on a glass substrate 61. A plurality of signal lines 81 extend from the signal line driver 68 while a plurality of scanning lines 82 extend from the scanning line driver 69 in a direction in which the plurality of scanning lines 82 intersect with the plurality of signal lines 81 at right angles. Thin film transistors 83 are formed, one near each of the intersections of the signal and scanning lines 68 and 69. The source electrode of each transistor 83 is connected to a respective one of pixel electrodes to be described later. The liquid crystal display panel 80 has a substrate (not shown) opposite to the glass substrate 61. Electrodes opposite to the corresponding pixel electrodes are formed on the inner surface of the opposite substrate. A liquid crystal is disposed between the glass and opposite substrates with the liquid crystal between a respective one of the opposite electrodes and the corresponding pixel electrode forming a liquid crystal capacitance 84. In FIG. 3, an NMOS thin film transistor 20 for a matrix circuit and a CMOS thin film transistor 50 for a peripheral circuit are formed on an upper surface of the glass substrate 21. The matrix transistor 20 corresponds to the transistor 83 of FIG. 5 while the peripheral circuit transistor 50 is one element which constitutes a part of each of the signal and scanning line drivers 68 and 69 of FIG. 5. Each of the signal and scanning line drivers 68 and 69 includes a number of CMOS transistors 50 and each of the CMOS transistors 50 comprises an NMOS thin film transistor 30 and a PMOS thin film transistor 40.

The matrix circuit transistor 20 has the same structure as the transistor of FIG. 1 while the NMOS and PMOS transistors 30 and 40 have the same structure as the transistor of FIG. 6.

In FIG. 3, the transistors 20, 30 and 40 have thin semiconductor films 22, 32 and 42, respectively, patterned at the predetermined positions on the substrate 21. The central portion of the film 22 of the transistor 20 is used as a channel region 22a with both side portions of the film 22 excluding its central portion being used as a source and a drain region 22b which include a high concentration impurity of an n-type (one conductivity type). A region 22c between the channel region 22a and each of the source and drain regions 22b includes a low concentration impurity of a p-type (the other conductor type). The central portion of the thin semiconductor film 32 of the NMOS thin film transistor 30 is used as a channel region 32a with both side portions of the film 32 excluding its central portion being used as a source and a drain region 32b which include a high concentration impurity of an n-type (one conductivity type). The central portion of the thin semiconductor film 42 of the PMOS thin film transistor 40 is used as a channel region 42a with both side portions of the film 42 excluding its central portion being used as a source and a drain region 42b which include a high concentration impurity of a p-type (one conductivity type). A gate insulation film 23 is formed on the whole surface of the thin semiconductor films 22, 32 and 42 and the substrate 21. Gate electrodes 24, 34 and 44 are formed on upper surfaces of those portions of the gate insulation film 23 corresponding to the channel regions 22a, 32a and 42a, respectively. A pixel electrode 28 of ITO (indium-tin oxide) is formed at a predetermined position on an upper surface of the gate insulation film 23. An inter-layer insulation film 25 is formed on the whole surface of the gate insulation film 23, the gate electrodes 24, 34 and 44 and the pixel electrode 28. Contact holes 26 are formed in the interlayer insulation film 25 and the gate insulation film 23 at positions corresponding to the source and drain regions 22b, 32b and 42b and one end of the pixel electrode 28. Drain electrodes 27 are formed in the respective contact holes 27 and at respective predetermined positions on the inter-layer insulation film 25. In this case, the drain electrode connects adjacent source and drain regions 32b and 42b of the NMOS and PMOS thin film transistors 30 and 40 to form a CMOS thin film transistor. One end of the pixel electrode 28 is connected to an adjacent one of the source and drain electrodes 27 of the matrix transistor 20.

Figure 7:
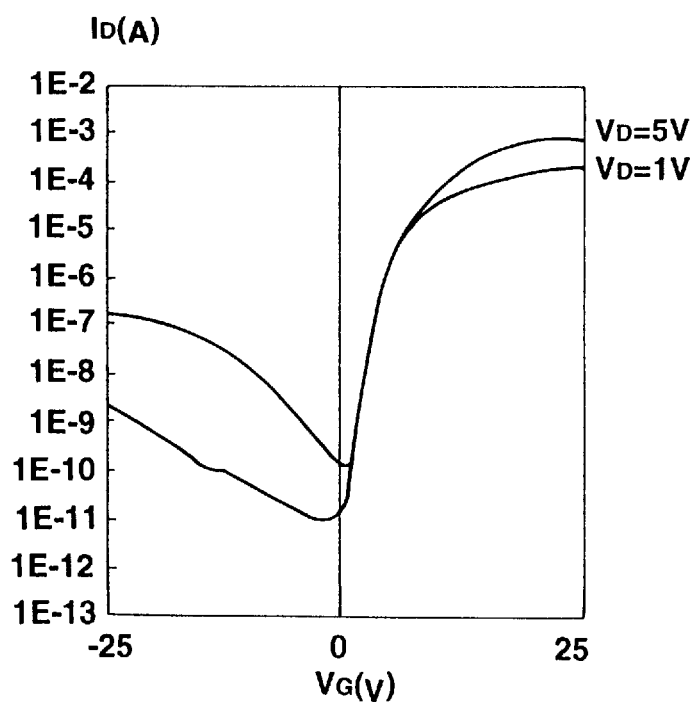
FIG. 7 is a diagram indicative of the $V_G$–$I_D$ characteristic of the transistor of FIG. 6.

In the case of the matrix circuit thin film transistor 20, both the off current and the leakage current are low, for example, as shown in FIG. 2, compared to the case of FIG. 7. Thus, when many such thin film transistors 20 are disposed in the form of a matrix, the whole consumed current is reduced greatly compared to the conventional case. In the case of the transistors 30 and 40, the on current is large by about one order of magnitude, for example, as shown in FIG. 7, compared to the case of FIG. 2. This implies that the mobility is improved to thereby permit the transistors 20, 30 and 40 to be driven with a high frequency clock pulse. Thus, the respective transistors 30 and 40 satisfy their required characteristics.

While in the above embodiment the peripheral circuit transistor 50 includes the CMOS thin film transistor which, in turn, includes the thin film transistor having the structure of FIG. 6, it may include the CMOS film transistor which, in turn, includes the thin film transistor having the structure of FIG. 1. While in the above embodiment, a top gate type thin film transistor has been described, the present invention is applicable to a bottom gate type thin film transistor.

Referring to FIGS. 4A to 4E, one example of the structure and operation of a bottom gate type CMOS thin film transistor to which the present invention is applied will be described below.

Figure 4A:
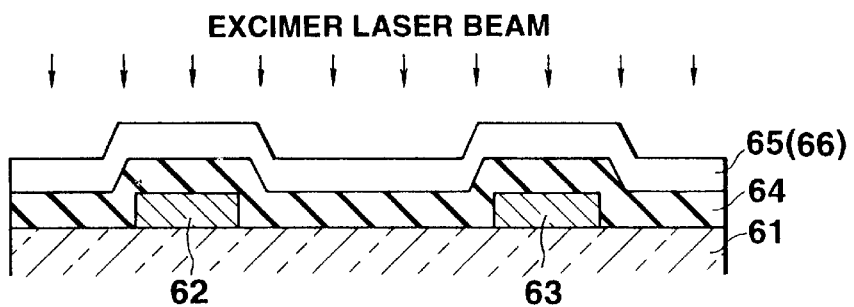
FIGS. 4A to 4E are enlarged cross-sectional views of half-finished products of another active matrix type liquid crystal display panel to which the present invention is applied, and corresponding to the respective steps of a semiconductor device making method involving the present invention.

First, as shown in FIG. 4A, a gate electrode 62 of an NMOS thin film transistor and a gate electrode 63 of a PMOS thin film transistor are formed at predetermined positions on an upper surface of a glass substrate 61. A gate insulation film 64 is then formed on the whole surface of the gate electrodes 62, 63 and the glass substrate 61. A thin amorphous silicon film 65 is then formed on the gate insulation film 64. The amorphous silicon film 65 is then irradiated with an excimer laser beam to crystalize the amorphus silicon film 65 into a thin polysilicon film (thin semiconductor film) 66.

One example of a method of irradiating the excimer laser beam in this case will be described with respect to FIG. 5.

In the state of FIG. 4A, the thin amorphous silicon film 65 is formed on the whole surface of the substrate 61, but no thin film transistors and leads are formed. The respective circuit elements are disposed in the following method on a straight line longitudinally in correspondence to a respective one of pixel rows. In other words, thin film transistors (TFTs) which are circuit elements which constitute a shift register or a transfer gate are disposed at the same position widthwise of a region 85 which forms the signal line driver 68. In the case, the channel width of the TFTs which constitute the shift register of the signal line driver is on the order of 20 to 30 μm while the channel width of the TFTs which constitute the transfer gate is on the order of 200 to 300 μm.

An optical system (not shown) causes the shape of the laser beam to take the form of a strip which extends parallel to the longitudinal axis of the signal line driver forming region 85, so that the irradiation region 70 of the excimer laser beam takes the form of a strip. In this case, since the irradiation energy of the laser beam corresponds to its irradiation area, the irradiation energy is, for example, the same when the irradiation area of the excimer laser beam takes the form of a square sized 10 mm×10 mm and when it takes the form of a strip sized 100 mm×1 mm or 200 mm×0.5 mm. Thus, an excimer laser beam having a width, for example, of 0.5–1.0 mm, is irradiated on the uppermost horizontal region portion of the signal line driver forming area 85. Next, the laser beam irradiation position is shifted by one line widthwise of the signal line driver forming region 85. In this case, a quantity of shift of the laser beam is adjusted such that a part of a new laser beam irradiation region overlaps with a part of the previous irradiation region. Thereafter, similarly, the laser beam is shifted widthwise of the signal line driver forming area 85 while performing a scanning irradiation. A similar scanning irradiation is performed for each of a scanning line driver 69 forming region 86 and a pixel switching element forming region 67 as well and is terminated at the end of each of the scanning line driver forming region 86 and the pixel switching element forming region 67. In the case of the embodiment, the length of the laser beam irradiation region is the same as or more than the length of the substrate 61; and the length of a one-time irradiation region is long enough compared to the sum of the horizontal widths of the scanning line driver forming region 86 and the pixel switching element forming region 67.

In this scanning irradiation of the laser beam, a predetermined width (for example, of 0.5–1.0 mm) of the signal driver forming region 85 is irradiated only once longitudinally in the signal driver forming region 85, so that there are no overlapped irradiated regions longitudinally in the signal driver forming region 85. Thus, the thin amorphus silicon film 65 formed in the signal line driver forming region 85 receives uniform energy through the overall length of the signal line driver forming region 85 and is crystallized. Thus, the sizes of the crystal grains of the thin polysilicon film 5 which constitutes a part of the signal line driver TFT are rendered uniform and hence the carrier mobilities are rendered uniform. In this case, there are regions irradiated doubly at predetermined intervals widthwise of the signal driver forming region 85, but the irradiation width of the laser beam is large enough compared to the respective sizes of the TFTs. Thus, the double irradiation region can be out of the TFT forming position. However, the double irradiation regions of the laser beam are not necessarily required to be out of the TFT forming region. As described above, the respective TFTs formed in the signal line driver forming region 85 are disposed on a single straight line at predetermined positions widthwise of the signal line driver forming region 85. Thus, even if there are double irradiation regions, they correspond to the same region in the respective TFTs, which impair no uniformness of the respective TFT characteristics. For example, even when all the TFT source regions are doubly irradiated with the laser beam, the uniformness of the characteristics of the TFTs is maintained. In the pixel switching element forming region 67 and the scanning line driver forming region 86, a double irradiation region is produced which extends vertically across the boundary of the laser beam irradiation region whereas, in the case of the pixel switching element TFT and scanning driver TFT, there are no substantial problems even when the carrier mobilities are somewhat uneven, because required mobilities of the TFTs in the region 67 and the scanning line driver 69 may be far lower.

Figure 4B:
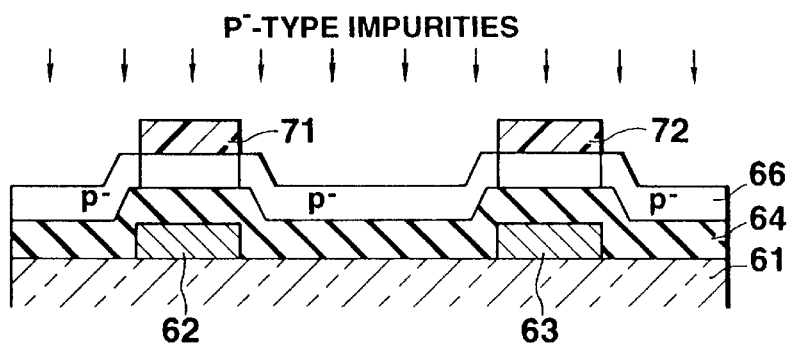

After the thin amorphous silicon film 65 is thus crystallized, a first photoresist layer (not shown) is formed on an upper surface of the thin polysilicon film 66. A lower surface (back) of the substrate 61 is then exposed to light with the gate electrodes 62 and 63 as masks and then developed, which provides first photoresist patterns 71 and 72 formed on upper surfaces of those portions of thin polysilicon film 66 corresponding to the gate electrodes 62 and 63, as shown in FIG. 4B. P-type impurities such as boron ions are then implanted so as to be of a low concentration with the first photoresist patterns 71 and 72 as masks. This forms p-type impurity low-concentration regions in the polysilicon film 66 except below the first photoresist patterns 71 and 72, which are then removed.

Figure 4C:
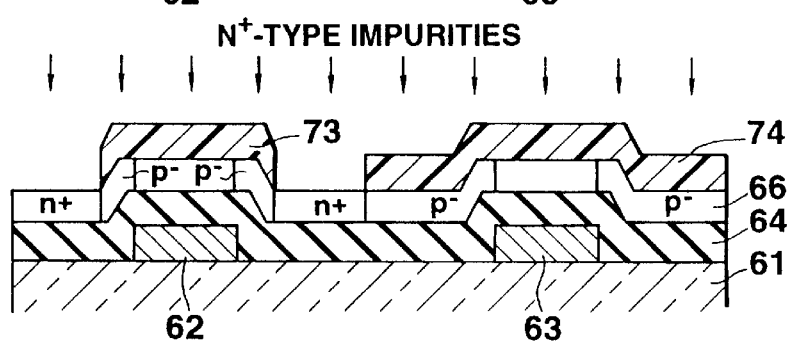

As shown in FIG. 4C, a second photoresist pattern 73 is then formed by regular photolithography on an upper surface of that portion of the polysilicon film 66 corresponding to a region which is larger by a predetermined area than the gate electrode 62 in the left-hand NMOS thin film transistor forming region. A second photoresist pattern 74 is formed by photolithography on that portion of the upper surface of the polysilicon film 66 corresponding to the whole region of the right-hand PMOS thin film transistor forming region in the right-hand PMOS thin film transistor forming region. N-type impurities such as phosphorus ions are then implanted with the second photoresist pattern 73, 74 as masks to form a high concentration n-type impurity region in the polysilicon film 66 except below the second photoresist patterns 73 and 74, which are then removed.

Figure 4D:
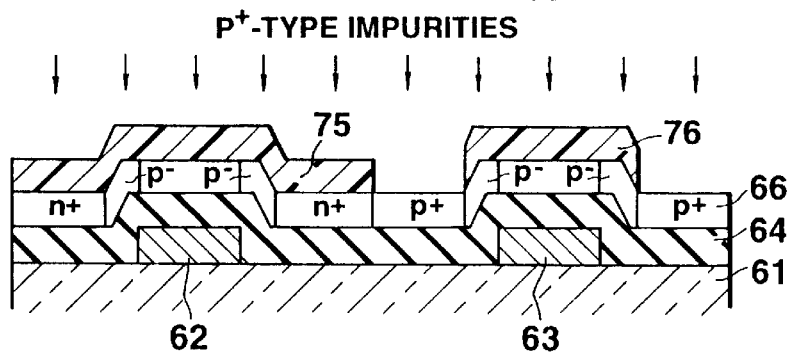

As shown in FIG. 4D, a third photoresist pattern 75 is formed by regular photolighography in the left-hand NMOS thin film transistor forming region on an upper surface of that portion of the polysilicon film 66 corresponding to the whole surface of the left-hand NMOS thin film transistor forming region. A third photoresist pattern 76 is formed on an upper surface of that portion of the polysilicon film 66 corresponding to a region which is larger by a predetermined area than the gate electrode 63 in the right-hand PMOS thin film transistor forming region. P-type impurities such as boron ions are then implanted with the third photoresist patterns 75, 76 as masks to form a high concentration p-type impurity region in the polysilicon film 66 except below the third photoresist patterns 75 and 76, which are then removed. The impurity implantation region is then activated.

Figure 4E:
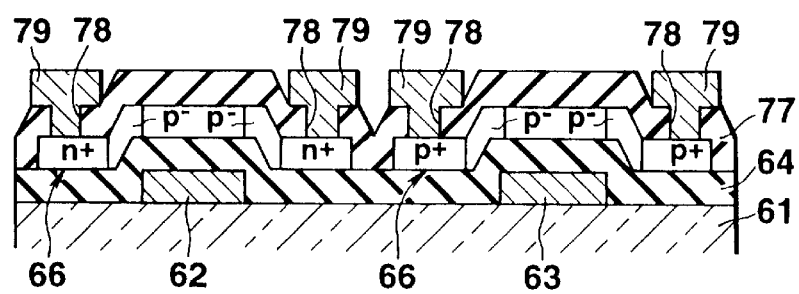

As shown in FIG. 4E, unnecessary portions of the polysilicon film 66 are then removed by element isolation. In this state, the central portion of the polysilicon film 66 in the left-hand NMOS thin film transistor forming region is a channel region; both the side portions of the polysilicon film 66 excluding its central portion are a source and a drain region of n-type high concentration impurity; and a low-concentration p-type impurity region is formed between the channel region and each of the source and drain regions. The central portion of the polysilicon film 66 in the right-hand PMOS thin film transistor forming region is a channel region; both the side portions of the polysilicon film 66 excluding its channel region are a source and a drain region of a high concentration p-type impurity; and a low concentration p-type impurity region is provided between the channel region and each of the source and drain regions. The steps of FIGS. 4B to 4E are performed such that the respective TFTs of the shift register and the transfer gate formed in the signal line driver forming region 68 are positioned on a straight line extending through the length of the signal line driver forming region 68. An inter-layer insulation film 77 is then formed on the whole surface of the elements and substrate. Contact holes 78 are then formed in the inter-layer insulation film 77 at positions corresponding to the source and drain regions. Parts of source and drain electrodes 79 which are connected to the source and drain regions through the contact holes 78 are formed on an upper surface of the inter-layer insulation film 77 to thereby complete a bottom gate type CMOS thin film transistor.

While in the above embodiment the matrix circuit thin film transistors and the peripheral circuit (signal line driver and the scanning line driver) thin film transistors have been described as formed on the same substrate, the matrix thin film transistors and the peripheral circuit thin film transistors may be formed on separate substrates, and not on the same substrate. While the display device having the driver has been described as the embodiment of the present invention, the present invention is also applicable to output devices having a driver for a printer and input devices having a driver for an opto-electric conversion element.

As described above, according to the present invention, a low concentration impurity region of another conductivity type is formed between the channel region and the drain region which includes a high concentration impurity of one conductivity type, so that the off current and hence the leakage current are reduced.

What is claimed is:

1. A method of making a thin film semiconductor device, comprising the steps of:
   providing a transparent substrate;
   forming a gate electrode on said substrate;
   forming a gate insulating film on at least said gate electrode;
   forming a thin amorphous silicon film on said gate insulation film;
   irradiating said amorphous silicon film with a laser beam to change the amorphous silicon film into a thin polysilicon film;
   forming a photoresist pattern on a region of said polysilicon film corresponding to said gate electrode;
   implanting an impurity of a first conductivity type into said polysilicon film with said photoresist pattern as a first mask to form a low concentration region;
   forming a second mask on a region of said polysilicon film corresponding to said gate electrode and a first portion of said low concentration region; and
   implanting an impurity of a second conductivity type into said polysilicon film to change a second portion of said low concentration region of said polysilicon film which is outside of said second mask to a high concentration impurity region of the second conductivity type.

2. A method according to claim 1, wherein
   said gate electrode comprises an opaque conductive metal; and
   said photoresist pattern forming step comprises the steps of:
   forming a photoresist film on the polysilicon film; and
   irradiating said photoresist film with light from the side of said transparent substrate to form a photoresist pattern self-aligned to a shape of the gate electrode.

3. A method of making a thin film semiconductor device which includes:
   a switching element region which includes a plurality of signal lines, a plurality of scanning lines intersecting with the plurality of signal lines, and a plurality of thin film switching elements one disposed near each of the intersections of the signal lines and the scanning lines;
   a signal line driver region which includes a plurality of thin film transistors for driving the corresponding plurality of signal lines; and
   a scanning line driver region which includes a plurality of thin film transistors for driving the corresponding plurality of scanning lines,
   said method comprising the steps of:
   providing a substrate on which the switching element region, the signal line driver region and the scanning line driver region are to be formed, said substrate having a predetermined width and length;
   forming a thin amorphous silicon film on the substrate;
   irradiating the amorphous silicon film with a laser beam to change the amorphous silicon film to a thin polysilicon film, said laser beam including an irradiation region having a length which is the same as or larger than the length of the substrate and having a width which is shorter than the width of the substrate;
   shifting the irradiation region of the laser beam in a width direction of the substrate such that a part of the irradiation region of the laser beam overlaps with a previous irradiation region, and irradiating the amorphous silicon film with the laser beam to change the amorphous silicon film to polysilicon film;
   repeating the irradiation of the amorphous silicon film with the laser beam until an end of each of the switching element region, the signal line driver region and the scanning line driver region to thereby change the amorphous silicon film of each of the irradiation regions to polysilicon film; and
   forming a thin film transistor including the polysilicon film in each of the signal line driver region and the scanning line driver region.

4. A method according to claim 3, wherein the signal line driver region and the laser beam irradiation region are formed so that their longitudinal axes are parallel, and the scanning line driver region and the laser beam irradiation region are formed so that their longitudinal axes intersect at right angles.

5. A method of making a thin film semiconductor device comprising the steps of:
   providing a substrate on which a drive circuit area is to be formed, said drive circuit area having a predetermined length and width;
   forming a thin amorphous silicon film on at least said drive circuit area of said substrate;
   irradiating said amorphous silicon film with a laser beam to change said amorphous silicon film to a thin polysilicon film, said laser beam including an irradiation area having a length which is not less than said length of said drive circuit area and having a width which is narrower than said width of said drive circuit area;

shifting said irradiation region of said laser beam in a width direction of said drive circuit area such that a part of said irradiation region of said laser beam overlaps with a previous irradiation region, and irradiating said amorphous silicon film with said laser beam to change said amorphous silicon film to a polysilicon film;

repeating said shifting step and said irradiating step until an end in said width direction of said drive circuit; and forming drive circuit semiconductor elements including thin polysilicon films as an active layer in said drive circuit area, wherein said length of said irradiation area of said laser beam is not less than 100 mm, and said width of said irradiation area of said laser beam is more than 0.5 mm.

6. The method according to claim 5, wherein said drive circuit elements include thin film transistors.

7. The method according to claim 6, wherein said thin film transistors comprise a shift register circuit.

8. The method according to claim 6, wherein said thin film transistors comprise a transfer gate circuit.

9. The method according to claim 6, wherein said thin film transistors comprise a signal line drive circuit.

10. The method according to claim 5, wherein said width of said irradiation area of said laser beam is not more than 1.0 mm.

11. The method according to claim 10, wherein said drive circuit elements include thin film transistors.

12. The method according to claim 11, wherein said thin film transistors comprise a shift register circuit.

13. The method according to claim 11, wherein said thin film transistors comprise a transfer gate circuit.

14. The method according to claim 11, wherein said thin film transistors comprise a signal line drive circuit.

* * * * *

UNITED STATES PATENT AND TRADEMARK OFFICE
CERTIFICATE OF CORRECTION

PATENT NO. : 5,821,137
DATED : October 13, 1998
INVENTOR(S) : WAKAI et al.

It is certified that error appears in the above-identified patent and that said Letters Patent is hereby corrected as shown below:

In the Title page, Item [56] References Cited, under "OTHER PUBLICATIONS" line 1, after "Silicides" insert --in Silicon--.

Signed and Sealed this

Fourth Day of January, 2000

Attest:

*Attesting Officer*

*Acting Commissioner of Patents and Trademarks*